United States Patent [19]

Schuster et al.

[11] Patent Number: 5,693,574
[45] Date of Patent: Dec. 2, 1997

[54] PROCESS FOR THE LAMINAR JOINING OF SILICON SEMICONDUCTOR SLICES

[75] Inventors: Günther Schuster, Gammelshausen; Klaus Pänitsch, Kirchheim, both of Germany

[73] Assignee: Deutsche Aerospace AG, Germany

[21] Appl. No.: 192,329

[22] Filed: Feb. 4, 1994

Related U.S. Application Data

[63] Continuation-in-part of Ser. No. 838,826, Feb. 21, 1992, abandoned.

[30] Foreign Application Priority Data

Feb. 22, 1991 [DE] Germany ............ 41 05 592.6

[51] Int. Cl.⁶ ................................... H01L 21/603
[52] U.S. Cl. ............... 437/225; 437/927; 437/974; 148/DIG. 12; 148/DIG. 58
[58] Field of Search ............... 437/225, 226, 437/233, 235, 974, 927; 148/DIG. 12, DIG. 58, DIG. 59

[56] References Cited

U.S. PATENT DOCUMENTS

| | | | |
|---|---|---|---|
| 3,200,490 | 8/1965 | Clymer | 437/209 |
| 3,925,808 | 12/1975 | Rai-Choudhury | 257/771 |
| 4,671,846 | 6/1987 | Shimbo et al. | 437/225 |
| 4,701,424 | 10/1987 | Mikkor | 148/DIG. 12 |
| 4,771,018 | 9/1988 | Bhattacharyya et al. | 437/209 |
| 4,810,671 | 3/1989 | Bhattacharyya et al. | 148/DIG. 12 |
| 4,810,672 | 3/1989 | Schwarzbauer | 148/DIG. 12 |
| 4,837,177 | 6/1989 | Lesk et al. | 437/233 |
| 4,975,390 | 12/1990 | Fujii et al. | 148/DIG. 135 |
| 5,037,778 | 8/1991 | Stark et al. | 148/DIG. 12 |
| 5,148,604 | 9/1992 | Bantien | 33/366 |
| 5,155,061 | 10/1992 | O'Connor et al. | 148/DIG. 159 |

FOREIGN PATENT DOCUMENTS

| | | | |
|---|---|---|---|
| S32506 | 1/1956 | Germany . | |
| 0101431 | 6/1983 | Japan | 437/209 |
| 62-260358 | 11/1987 | Japan . | |
| 0122036 | 1/1989 | Japan . | |
| 0128513 | 5/1989 | Japan | 437/233 |
| 87/05746 | 9/1987 | WIPO . | |

OTHER PUBLICATIONS

Ghandhi, "VLSI Fabrication Principles", 1983, pp. 420–421, 432–433.

*Primary Examiner*—Michael Trinh
*Attorney, Agent, or Firm*—Evenson, McKeown, Edwards & Lenahan P.L.L.C.

[57] ABSTRACT

A process for the laminar joining of two or more silicon semiconductor slices (wafers) under the effect of pressure and heat, in which a thin layer of a semiconductor-compatible material is applied to at least one of the surfaces to be joined.

5 Claims, 3 Drawing Sheets

PROCESS FOR THE LAMINAR JOINING OF SILICON SEMICONDUCTOR SLICES

This application is a Continuation-In-Part of U.S. application Ser. No. 07/838,826, filed on Feb. 21, 1992, now abandoned.

BACKGROUND AND SUMMARY OF THE INVENTION

This invention relates to a process for the laminar joining of silicon semiconductor slices (wafers) under the effect of pressure and heat.

It is known to join silicon parts, such as semiconductor chips, with carrier materials (substrates) by means of gluing. However, because of the different characteristics of the materials of the adhesive substance and the silicon, this process results in a number of problems, such as thermomechanical stress phenomena.

Attempts have been made to eliminate such problems by subjecting components (particularly semiconductor components with silicon, which are integrated on chips or other substrates) to an artificial thermal aging in a so-called "burn-in" test. Components, chips and the like which do not withstand such artificially induced thermomechanical stress forces will then become waste.

Another disadvantage of the known gluing process is the fact that the thickness of the junction has relatively high tolerances. Thus, gluing processes are not very suitable for the laminar joining of wafers in the fields of electronics, microelectronics, micromechanics and the like.

Other joining processes for semiconductor slices, for example wafer direct bonding, anodic bonding and thermocompression bonding, are also known. Wafer direct bonding, however, requires very high temperatures in the range of 1,000° C., which limits the use of the process to those applications where the wafers can be joined at the start of the process. In the case of anodic bonding, on the other hand, glass is required as the joining partner, which limits the compatibility of the material and the process. In addition, anodic bonding requires relatively long process times which results in high costs with respect to series production. Finally, thermocompression bonding requires use of a noble metal as the joint carrier. Such noble metals interfere with normal silicon semiconductor components, and have a negative influence on the reliability or long-time stability of the components. Use of noble metals also prevent the use of heavy-metal-ion-sensitive components.

It is therefore an object of the invention to provide a process of the initially mentioned type which permits a cost effective series production, can be used universally, causes no limitations with respect to the type of silicon parts used, requires no materials that are damaging or unfavorable for silicon semiconductor components, and results in a joint that is free of thermomechanical stress.

This object is achieved by the application, in the presence of a vacuum, of multiple layers of aluminum and germanium to the silicon wafer or substrate. Because of such multilayer application of silicon-compatible materials in a vacuum according to this process, low manufacturing cost, long-time stability and universal usability are achieved in a joint that is free of thermal stress.

The objects are also achieved by an embodiment of the present invention of a process for the laminar joining of silicon slices by applying a thin layer of a highly semiconductor-compatible material to at least one surface of at least one of these slices. The method includes applying the thin layer to a surface of the silicon slice which carries component parts, whereby the component parts are integrated into the thin layer of highly semiconductor-compatible material.

The objects are also achieved by another embodiment of the present invention which provides a process for the laminar joining of silicon slices by applying a thin layer made of a highly semiconductor-compatible material to one surface of each of at least two silicon slices, at least one of these surfaces also containing component parts. The silicon slices are placed above one another with the applied thin layers facing one another so that the component parts are integrated by means of the joining layers. A fixed contact pressure is applied to the slices, with a simultaneous heating, during a fixed time period.

Other objects, advantages and novel features of the present invention will become apparent from the following detailed description of the invention when considered in conjunction with the accompanying drawings.

DETAILED DESCRIPTION OF THE DRAWINGS

Figure 1:
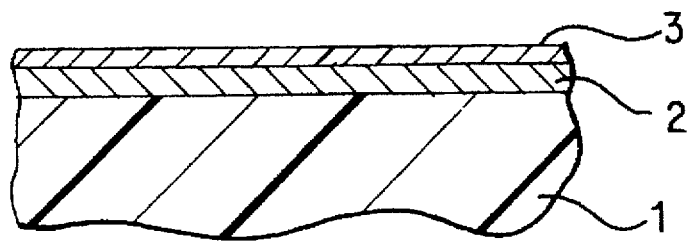
FIG. 1 is a schematic-representation of a sectional view of a silicon wafer with an aluminum-germanium layer system according to the invention.
Figure 2:
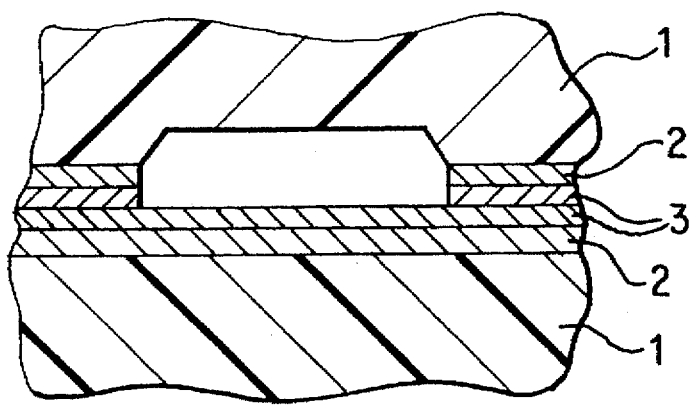
FIG. 2 is a schematic representation of two silicon wafers having aluminum-germanium layer systems and being stacked above one another.
Figure 3:
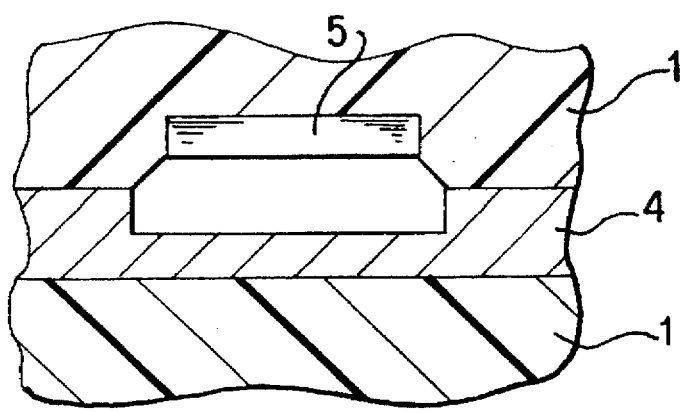
FIG. 3 is a schematic representation of a sectional view after the alloying process, of two silicon wafers having the aluminum-germanium layer systems, and being placed above one another.
Figure 1A:
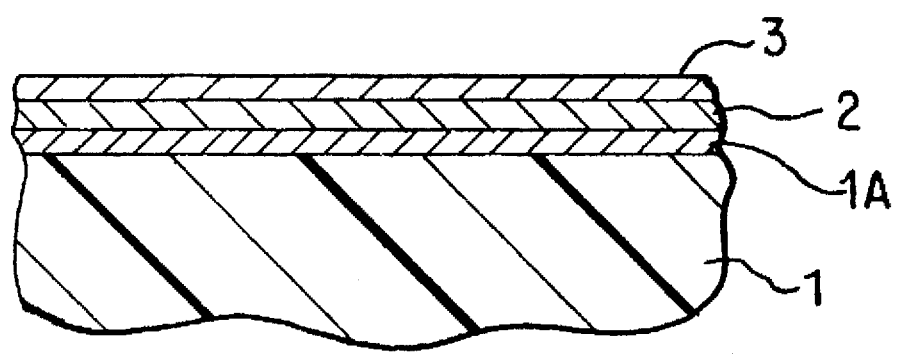
FIG. 1A is a schematic representation of an alternative embodiment of the configuration of FIG. 1.

FIG. 1 illustrates a silicon wafer 1, to the surface of which a thin layer of aluminum 2 and, above it, a thin layer of germanium 3 were applied in the presence of a vacuum according to a physical or chemical depositing method, in a manner that is known per se. In addition, in a preferred embodiment, a dielectric insulating layer or a metallic layer may be applied as an intermediate layer between the thin layer and the surface of the semiconductor material (See FIG. 1.A, which shows the intermediate layer 1A between the thin layers of aluminum and germanium, and the surface of the semiconductor slice.) The layer thicknesses for aluminum and germanium are preferably in the micron range, being less than 10μ, and in a preferred embodiment less than 5μ. FIG. 2 shows two silicon wafers 1 of this type which were placed on one another with the respective applied layers of aluminum and germanium 2 and 3. If these silicon wafers 1 are now acted upon by a contact pressure and heated in the process, the germanium 3, as a result of diffusion phenomena at the interface with the aluminum 2, forms an alloy which, as time progresses and if the layer thicknesses of the aluminum 2 and the germanium 3 are selected appropriately as provided above, develops into a eutectic alloy system of aluminum and germanium. This condition is illustrated in FIG. 3, where the two silicon wafers 1 are joined by the eutectic aluminum-germanium system 4. Here, in the special case of the eutectic aluminum-germanium system 4, temperatures in the range of up to 450° C. are required, whereby standard semiconductor elements 5 may be contained in the silicon wafers 1 which are not at all influenced by the process.

The invention is to be used in silicon systems, particularly for components of electronics, microelectronics, micromechanics and wherever functional units are combined in integrated circuits. This includes the integration of analog and digital built-in functions, as well as peripheral components and memories, on a chip. The process may also be used for joining techniques for maximum packing densities, such as the joining of a silicon sensor with signal amplification, signal regeneration, signal processing and evaluation, all on a common module, or the joining of mechanical-electronic systems or optoelectronic systems with one another and possibly also with microprocessors or microcontrollers (so-called intelligent modules). It does not matter in this case whether universally usable so-called standard modules are involved or customized modules, so-called ASICS. It is also not important with respect to the invention whether the integrated modules, such as chips, are connected with the respective systems byway of lines or by means of telemetry.

Figure 4:
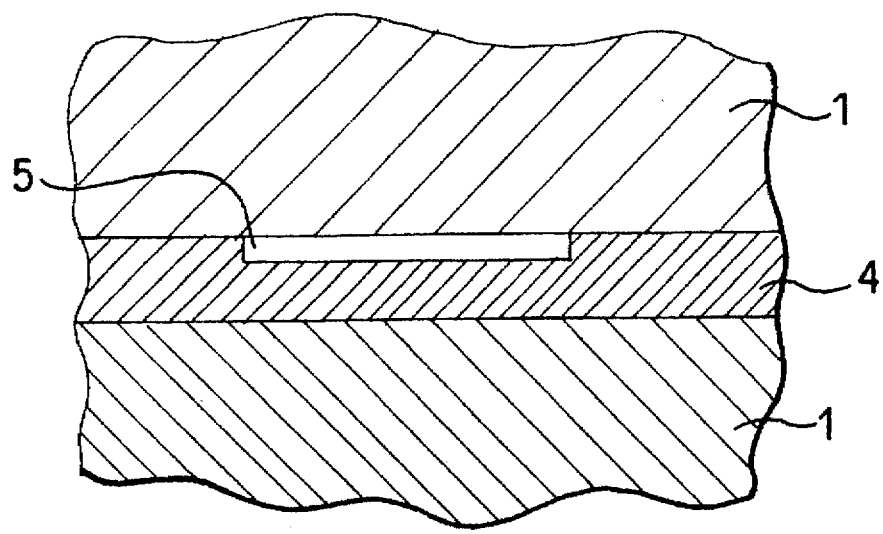
FIG. 4 is a schematic representation of a sectional view after the alloying process according to another embodiment of the present invention.

FIG. 4 illustrates an embodiment in which the electronic components 5 are carried by the surface of one of the silicon slices 1. The thin layer of semiconductor-compatible material, such as the aluminum 2 and germanium 3 layers, is applied to the surface of the silicon slice 1. The electronic components 5 are integrated into the thin layer of semiconductor-compatible materials 4 when the processing is complete.

Figure 5:
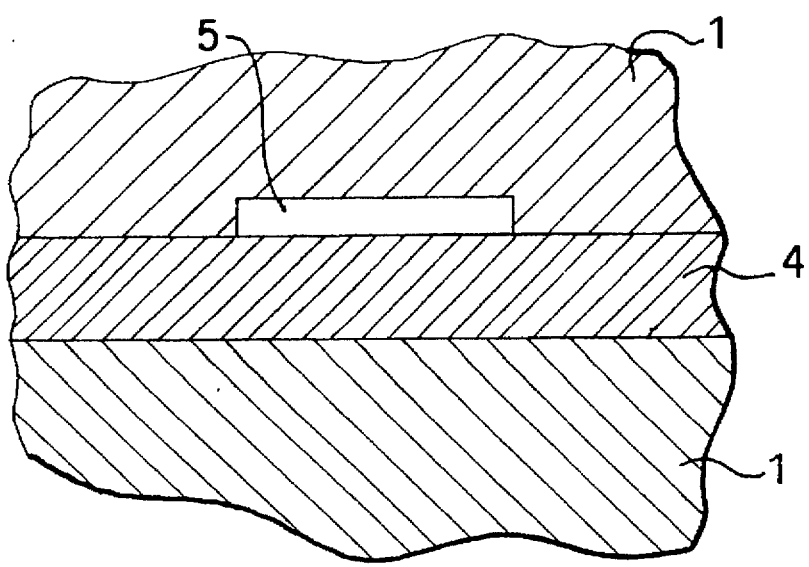
FIG. 5 is a schematic representation of a sectional view after the alloying process according to still another embodiment of the present invention.

FIG. 5 illustrates an embodiment in which the electronic components 5 are contained in the surface of at least one of the silicon slices 1. After the thin layers are applied and the silicon slices 1 are placed above one another, a fixed contact pressure is applied to the slices 1 with simultaneous heating for a predetermined time period. In this manner, the component parts 5 are integrated by means of the joining layers.

For both FIGS. 4 and 5, only the final product, as in FIG. 3, is shown. The individual layers of aluminum and germanium are not illustrated, but the process for both embodiments are similar to that depicted in FIGS. 1 and 2.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. Process for laminar joining of at least two silicon semiconductor slices, each having a front side and a back side, under the effect of heat, with microelectronic components being integrated in a recess in the front side of one of said silicon semiconductor slices, said process comprising the steps of:

applying a first layer of aluminum to a front side of each of said silicon semiconductor slices;

applying a second layer of germanium on top of said first layer of each of said silicon semiconductor slices, said first and second layers having an overall thickness of less than 10 µm;

stacking said silicon semiconductor slices on top of one another with the front sides thereof facing one another;

causing said first and second layers to combine to form a eutectic alloy joining layer between said silicon semiconductor slices, by simultaneously applying heat and pressure to said silicon semiconductor slices.

2. Process according to claim 1, wherein the thickness of the first and second layers are less than 5µ.

3. Process according to claim 1 further comprising the step of applying an intermediate layer between said first layer and said front side of at least one of said silicon semiconductor slices, said intermediate layer comprising a material selected from the group consisting of a dielectric insulator material and a metallic material.

4. Process according to claim 1, wherein said first and second applying steps are performed by a physical or chemical precipitation process, in the presence of a vacuum.

5. A process for laminar joining of at least two silicon slices, at least one of which has microelectronic components arranged in a recess therein and each of which has a first layer comprising aluminum on a surface thereof and a second layer comprising germanium on top of said first layer, said process comprising the steps of:

placing said silicon slices in contact with one another, with said first and second layers and disposed therebetween;

applying a contact pressure to said silicon slices; and heating said silicon slices and layers while applying said contact pressure.

* * * * *